United States Patent
Ramsbey et al.

(10) Patent No.: US 6,720,133 B1
(45) Date of Patent: Apr. 13, 2004

(54) MEMORY MANUFACTURING PROCESS USING DISPOSABLE ARC FOR WORDLINE FORMATION

(75) Inventors: Mark T. Ramsbey, Sunnyvale, CA (US); Kouros Ghandehari, Santa Clara, CA (US); Tazrien Kamal, San Jose, CA (US); Jean Y. Yang, Sunnyvale, CA (US); Emmanuil Lingunis, San Jose, CA (US); Hidehiko Shiraiwa, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 62 days.

(21) Appl. No.: 10/126,280

(22) Filed: Apr. 19, 2002

(51) Int. Cl.[7] .............................. G03F 7/00; G03F 7/26
(52) U.S. Cl. ...................... 430/312; 430/311; 430/313; 430/314; 430/316; 430/317; 430/318; 430/950
(58) Field of Search .................... 430/311, 312, 430/313, 314, 316, 317, 318, 950

(56) References Cited

U.S. PATENT DOCUMENTS 6,204,159 B1 * 3/2001 Chang et al. ............... 438/594
6,479,348 B1 * 11/2002 Kamal et al. ............... 438/258
6,617,215 B1 * 9/2003 Halliyal et al. ............. 438/288
6,620,717 B1 * 9/2003 Kamal et al. ............... 438/587
2003/0190786 A1 * 10/2003 Ramsbey et al. ........... 438/258

* cited by examiner

Primary Examiner—Mark F. Huff
Assistant Examiner—Nicole Barreca
(74) Attorney, Agent, or Firm—Mikio Ishimaru

(57) ABSTRACT

A method of manufacturing an integrated circuit includes a semiconductor substrate having bitlines under a charge-trapping material over a core region and a gate insulator material over a periphery region. A wordline-gate material, a hard mask, and a first photoresist are deposited and patterned over the core region while covering the periphery region. After removing the first photoresist, wordlines are formed from the wordline-gate material in the core region. An anti-reflective coating and a second photoresist are deposited and patterned over the periphery region and covering the core region. The anti-reflective coating is removable without damaging the charge-trapping material. After removing the second photoresist and the anti-reflective coating, gates are formed from the wordline-gate material in the periphery region and the integrated circuit completed.

20 Claims, 6 Drawing Sheets

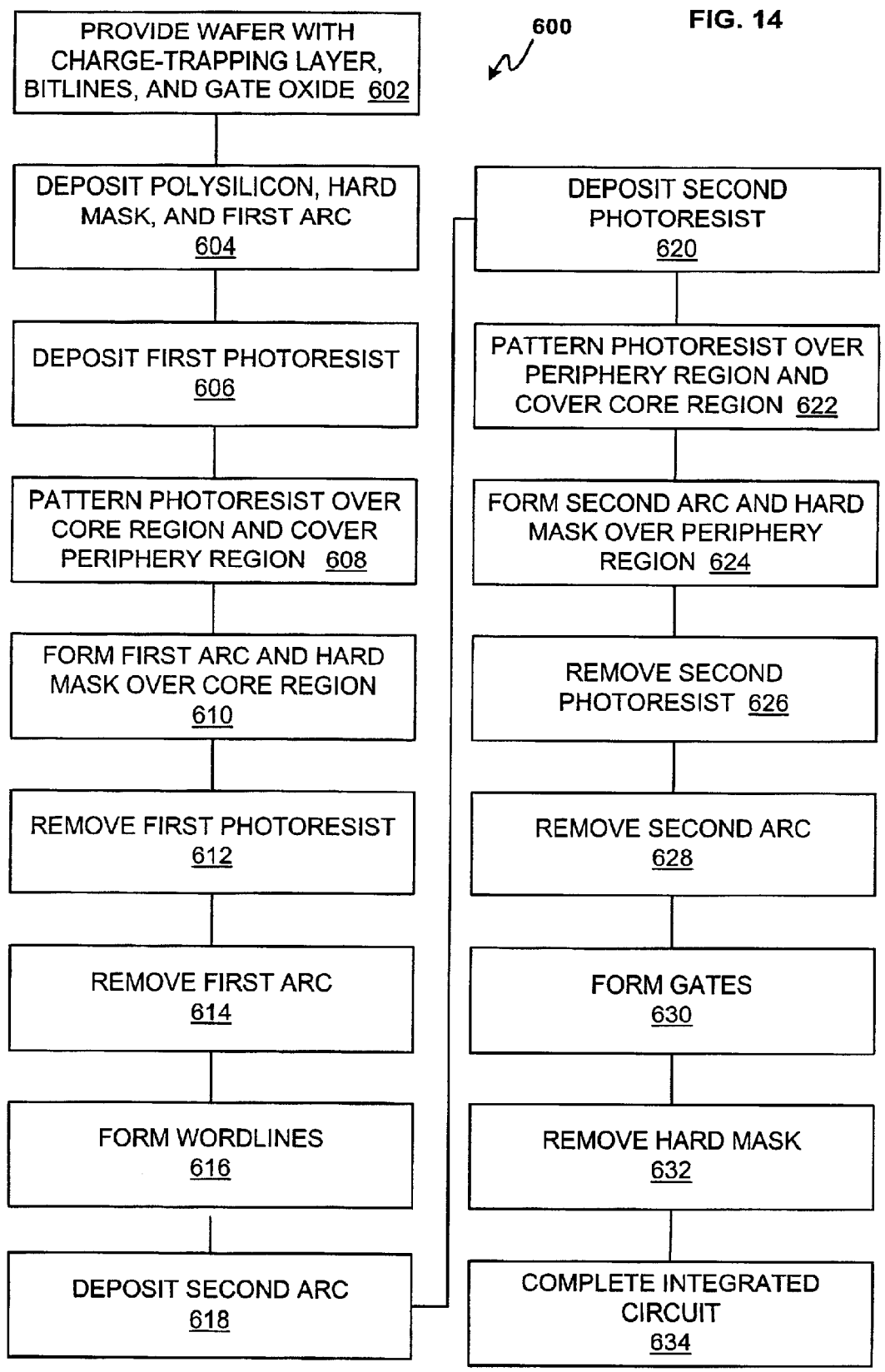

MEMORY MANUFACTURING PROCESS USING DISPOSABLE ARC FOR WORDLINE FORMATION

BACKGROUND OF THE INVENTION

1. Technical Field

The present invention relates generally to semiconductor technology and more specifically to reducing the number of steps in forming MirrorBit® Flash memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

Major problems in the MirrorBit® architecture can occur during the process for removing the anti-reflective coating (ARC) layers used to pattern core wordlines and peripheral gates. Because the ARC removal process attacks materials used in the charge-trapping dielectric layer, it can allow the formation of conductive silicides in the areas between the bitlines, which can result in short-circuiting the bitlines. It can also cause charges to leak out of the charge-trapping dielectric layer resulting in the loss of important information.

In order to prevent this from happening, a number of additional production steps were required in which exposed materials were protected from attack by the deposition of additional mask layers. While avoiding the problems associated with the ARC removal, the additional steps require increased time, expense, and complexity.

A faster, less expensive, solution to the ARC removal problem that reduces the number of required steps has been long sought but has long eluded those skilled in the art.

DISCLOSURE OF THE INVENTION

The present invention provides a method of manufacturing an integrated circuit with a semiconductor substrate having bitlines under a charge-trapping layer over a core region and a gate insulator layer over a periphery region. A wordline-gate layer, a hard mask, and a first photoresist are deposited and patterned over the core region while covering the periphery region. After removing the first photoresist, wordlines are formed from the wordline-gate layer in the core region. An anti-reflective coating and a second photoresist are deposited and patterned over the periphery region and covering the core region. The anti-reflective coating is removable without damaging the charge-trapping layer. After removing the second photoresist and the anti-reflective coating layer, gates are formed from the wordline-gate layer in the periphery region and the integrated circuit completed. While avoiding the problems associated with the ARC layer removal, the production steps require less time, are less expensive, and make for a simpler process than the prior art.

The above and additional advantages of the present invention will become apparent to those skilled in the art from a reading of the following detailed description when taken in conjunction with the accompanying drawings.

BRIEF DESCRIPTION OF THE DRAWINGS

FIG. 14 is shown a simplified process chart of the present invention.

BEST MODE FOR CARRYING OUT THE INVENTION

Figure 1:
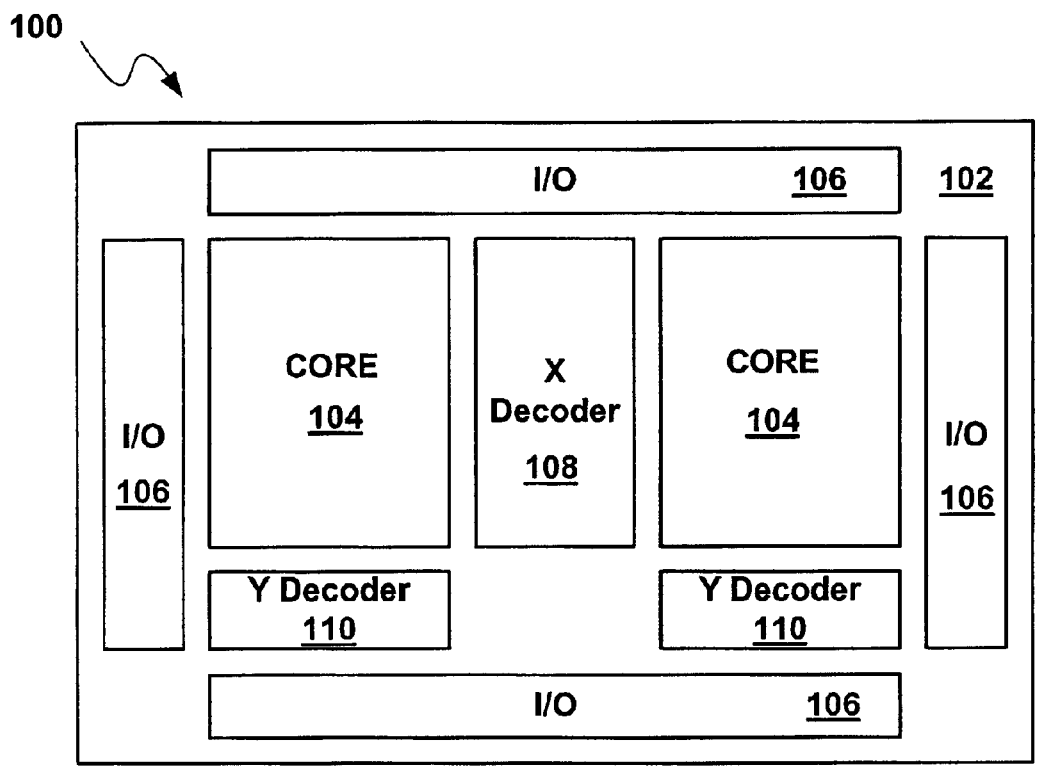
FIG. 1 is a plan view of a MirrorBit Flash EEPROM according to the present invention.

Referring now to FIG. 1, therein is shown a plan view of a MirrorBit® Flash EEPROM 100, which commonly includes a semiconductor substrate 102 in which one or more high-density core regions and one or more low-density peripheral portions are formed. The EEPROM 100 is manufactured according to the process of the present invention. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "thick", "side-" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
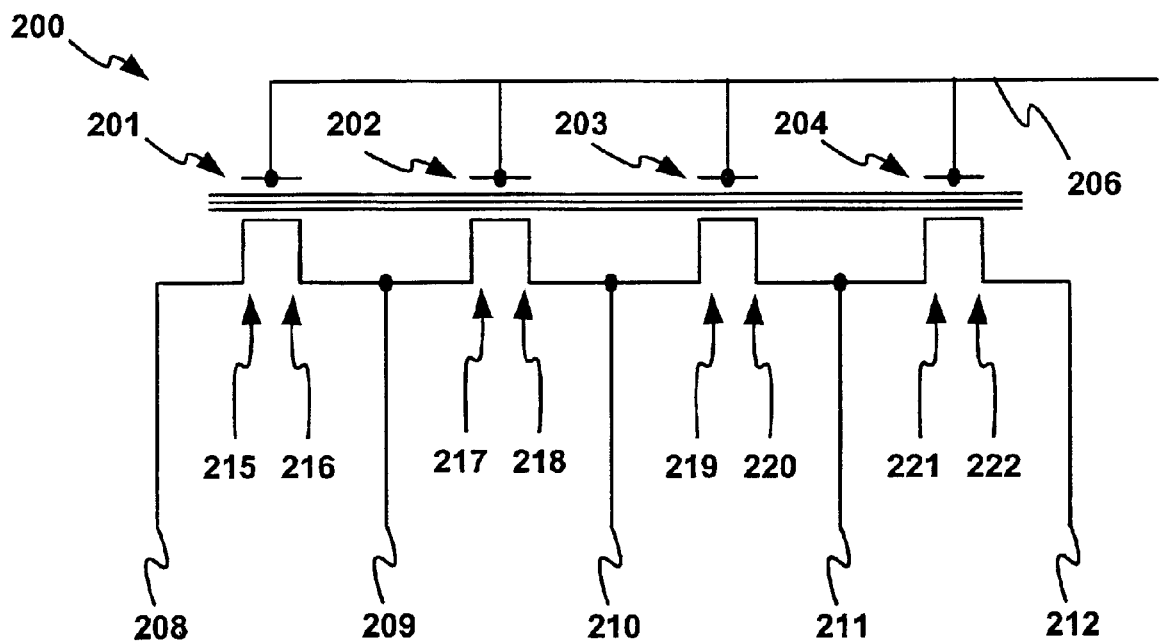
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
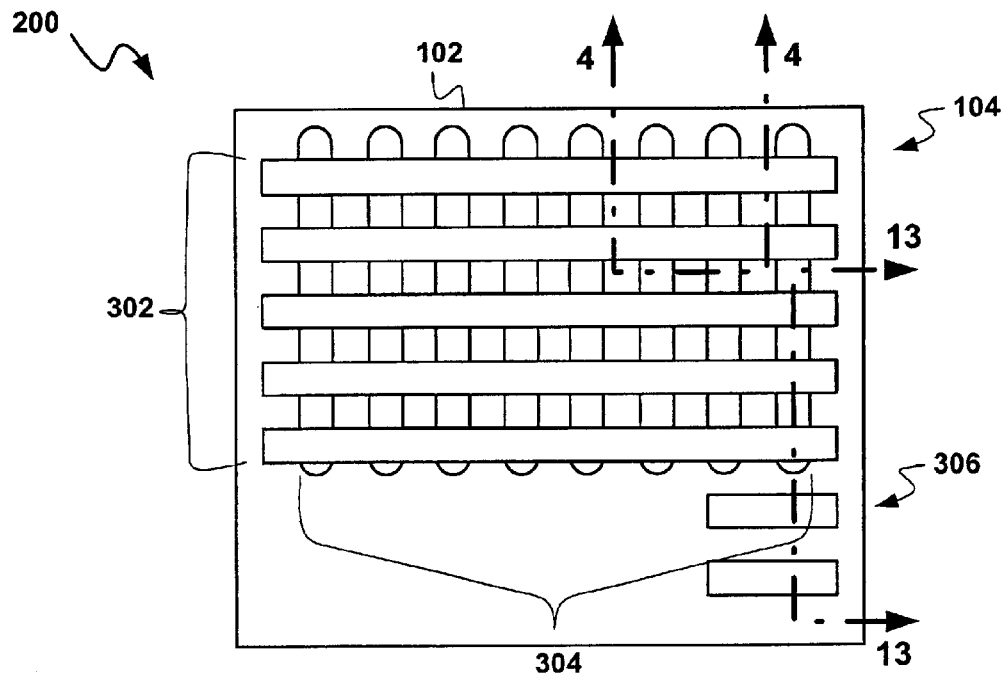
FIG. 3 is a plan view of a portion of one of the M×N array cores and periphery gates of FIG. 1.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to transistors 306 of the programming circuitry represented in part by x-decoders 108 and y-decoders 110 of FIG. 1.

Figure 4:
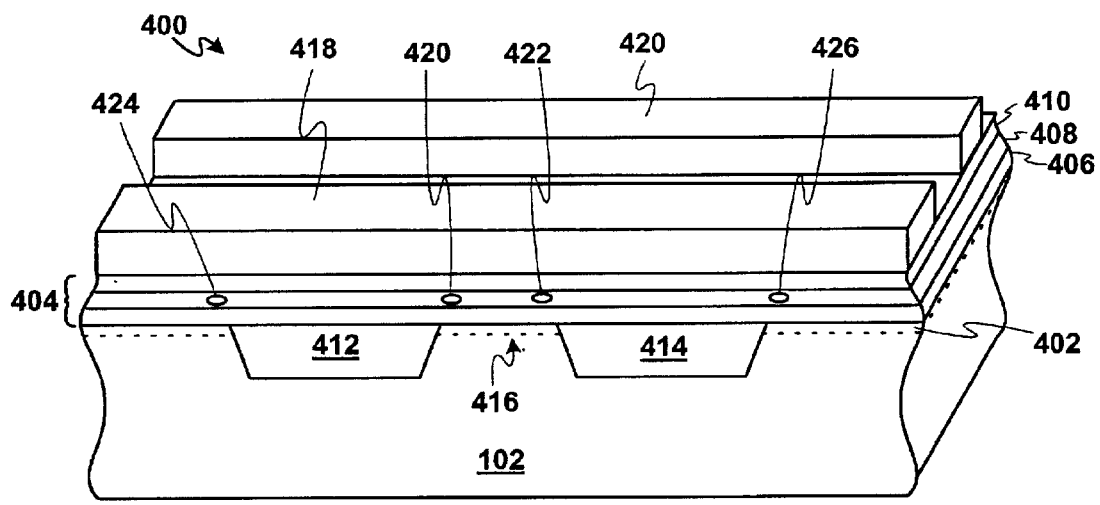
FIG. 4 is a cross-sectional isometric view of a memory cell along the line 4—4 of FIG. 3.

Referring now to FIG. 4, therein is shown a cross-sectional isometric view of a typical MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
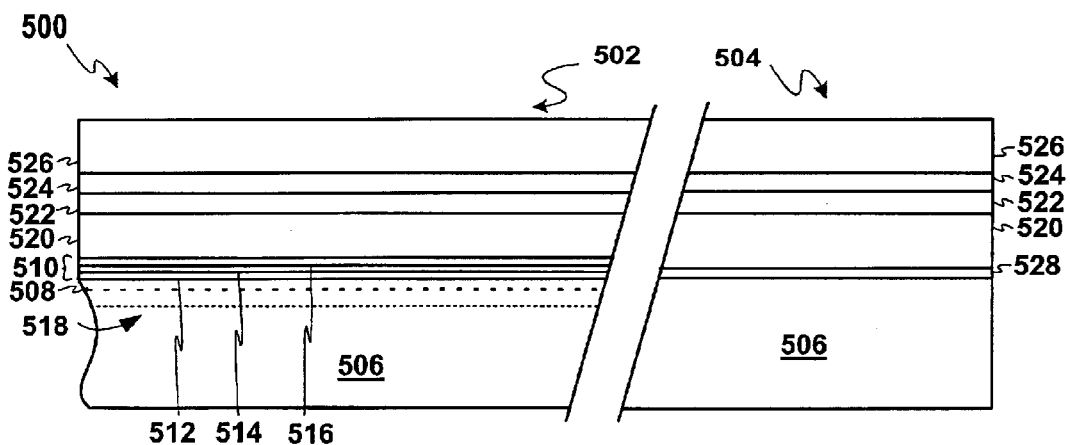
FIG. 5 is a cross-sectional view of a partially processed EEPROM, including a core region and a periphery region covered by various layers of material.

Referring now to FIG. 5, therein is shown a cross-sectional view of a partially processed EEPROM 500, which has a core region 502, which will be densely covered with MirrorBit Flash cells when processing is complete, and a periphery region 504, which will be less dense and will have other control devices thereon.

In the core region 502, where memory cells are to be formed, a p-type silicon substrate 506 has been implanted or processed with a p-type threshold adjustment implant 508. A charge-trapping dielectric layer 510 is deposited over the silicon substrate 506. The charge-trapping dielectric layer 510 generally can be composed of three separate layers: a first insulating layer 512, a charge-trapping layer 514, and a second insulating layer 516. The first and second insulating layers 512 and 516 may be of an oxide dielectric such as silicon dioxide ($SiO_2$) and the charge-trapping layer 514 may be of a nitride dielectric such as silicon nitride (SiN) to form an ONO layer. It will be noted that the present invention is not limited to specific dielectric or charge-trapping materials. The bitlines, as typified by a first n-type bitline 518, are implanted under the charge-trapping dielectric layer 510 in the silicon substrate 506.

In the periphery region 504, where transistors will be formed, a gate dielectric layer 528 is deposited on the silicon substrate 506. The gate dielectric layer 528 generally is a gate oxide, or silicon dioxide.

A wordline-gate layer 520, of a material such as polysilicon, has been deposited over the charge-trapping dielectric layer 510 and the gate dielectric layer 528. A hard mask layer 522 has been deposited over the wordline-gate layer 520 and an optional first anti-reflective coating (ARC) layer 524, typically composed of silicon nitride (SiON) or a similar material ($Si_xN_y$), is deposited over the hard mask layer 522. A first photoresist layer 526 is deposited over the first ARC layer 524.

Figure 6:
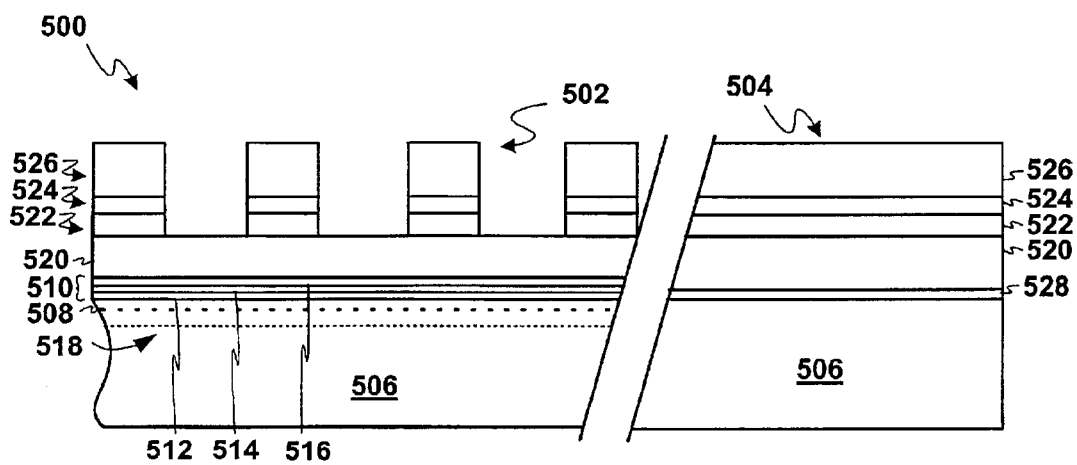
FIG. 6 is the structure of FIG. 5 after patterning of the core region.

Referring now to FIG. 6, therein is shown the structure of FIG. 5 after the first photoresist layer 526 is processed to pattern the core region 502 while the periphery region 504 is left covered or unpatterned. The first ARC layer 524 and the hard mask layer 522 have been processed and patterned in the core region 502 using the first photoresist layer 526. The hard mask layer 522 and the first ARC layer 524 remain unpatterned in the periphery region 504.

Figure 7:
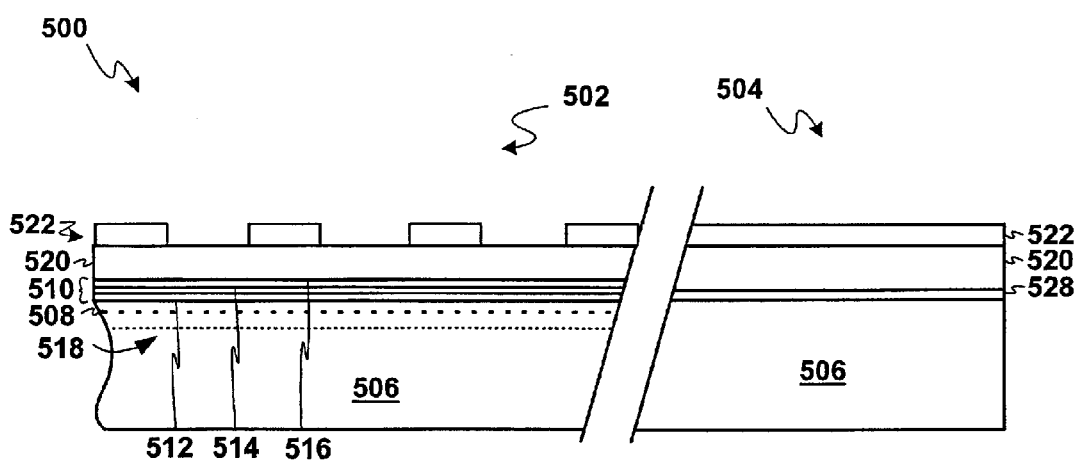
FIG. 7 is the structure of FIG. 6 after removal of a first photoresist layer and a first anti-reflective coating layer.

Referring now to FIG. 7, therein is shown the structure of FIG. 6 after removal of the first photoresist layer 526 and the first ARC layer 524. This process leaves the hard mask layer 522 patterned in the core region 502 and unpatterned in the periphery region 504.

Figure 8:
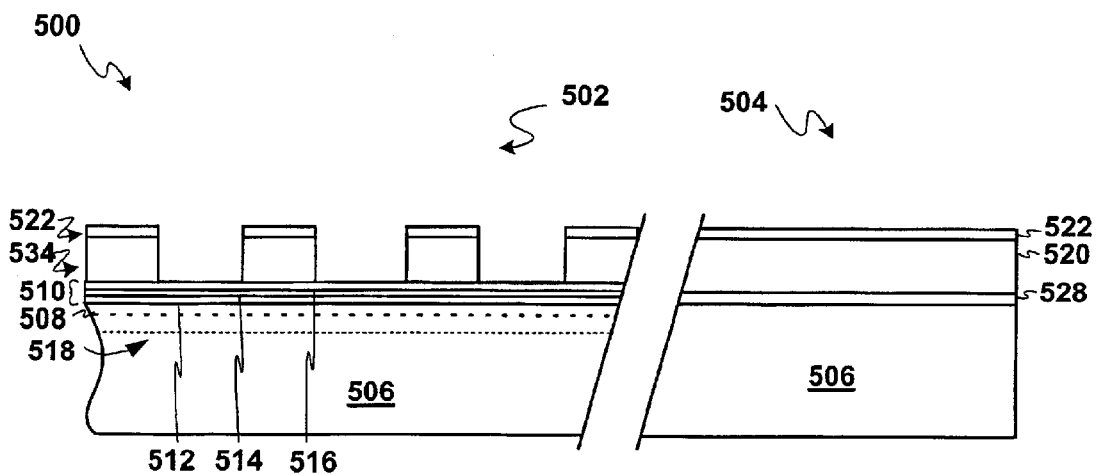
FIG. 8 is the structure of FIG. 7 after formation of wordlines.

Referring now to FIG. 8, therein is shown the structure of FIG. 7 after the wordline-gate layer 520 has been processed and patterned in the core region 502 using the patterned portion of the hard mask layer 522 to form wordlines 534. Wordlines are not formed in the periphery region 504 because the hard mask layer 522 covers the wordline-gate layer 520.

Figure 9:
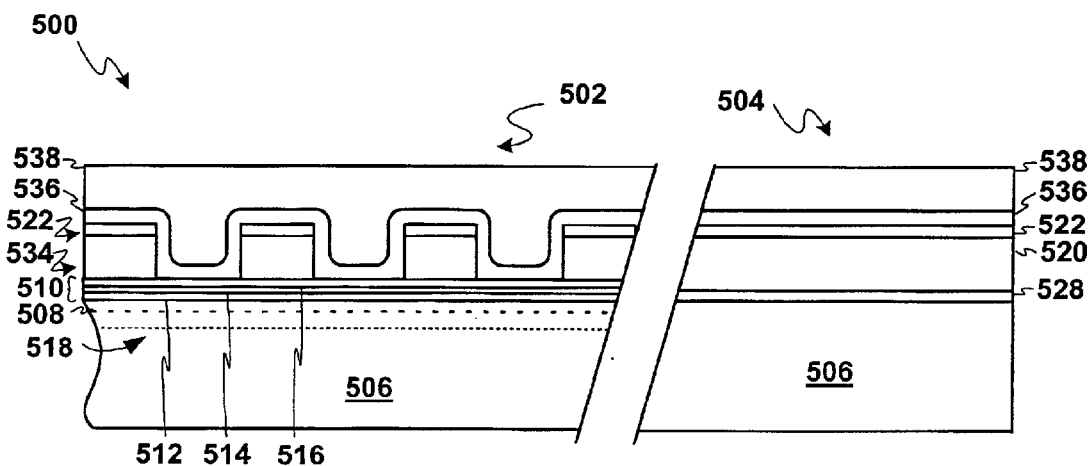
FIG. 9 is the structure of FIG. 8 after deposition of a second anti-reflective coating layer and a second photoresist layer.

Referring now to FIG. 9, therein is shown the structure of FIG. 8 after a second ARC layer 536 and a second photoresist layer 538 are deposited over the wordlines 534 and the hard mask layer 522.

Figure 10:
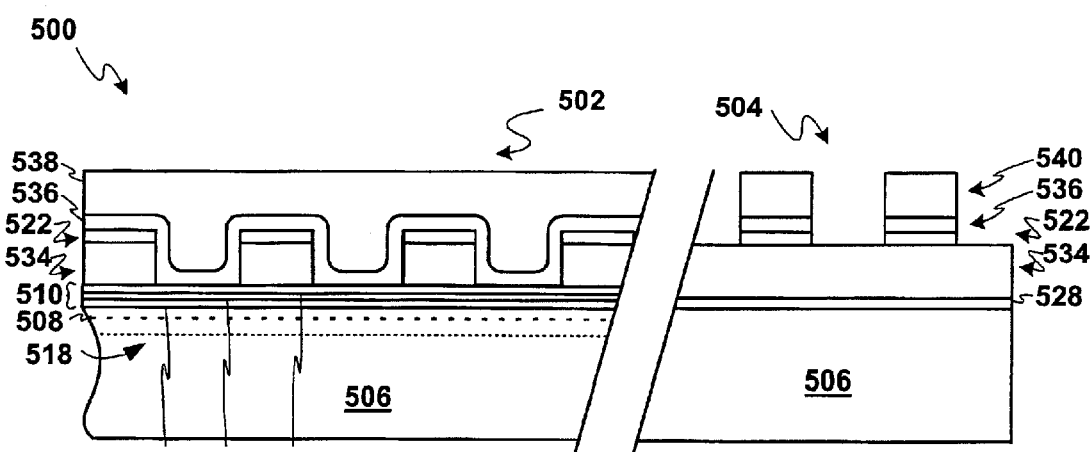
FIG. 10 is the structure of FIG. 9 after patterning of the periphery region.

Referring now to FIG. 10, therein is shown the structure of FIG. 9 after the second photoresist layer 538 is processed to pattern the periphery region 504 while the core region 502 is left covered or unpatterned. The second ARC layer 536 and the hard mask layer 522 have been processed and patterned in the periphery region 504 using the second photoresist layer 538. The hard mask layer 522 and the second ARC layer 536 remain unpatterned in the core region 502.

Figure 11:
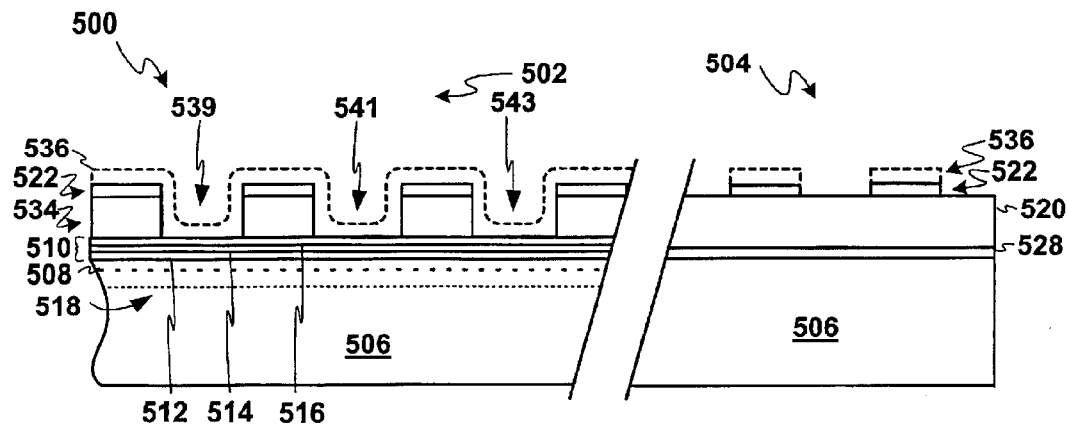
FIG. 11 is the structure of FIG. 10 after removal of the second photoresist layer and the second anti-reflective coating.

Referring now to FIG. 11, therein is shown the structure of FIG. 10 after removal of the second photoresist layer 538 and the second ARC layer 536. The second ARC layer 536 is shown in dotted lines to emphasize that it is on, or in contact with, the charge-trapping layer 510. Major problems in the MirrorBit® architecture can occur during this process for removing the second ARC layer 536 because the removal process attacks the materials used in the charge-trapping dielectric layer 510 and is most severe where the two materials are in contact in regions 539, 541, and 543. Because the ARC removal process attacks materials used in the charge-trapping dielectric layer 510, it can allow the formation of conductive silicides in the areas between the bitlines in regions 539, 541, and 543, which can result in short-circuiting the bitlines 304 of FIG. 3 (the bitline 518 of FIGS. 5 et al.). It can also cause charges to leak out of the charge-trapping dielectric layer 510 resulting in the loss of important information.

In order to prevent this from happening, a number of production steps were previously required in which exposed materials were protected from attack by the deposition of various mask layers. While avoiding the problems associated with the ARC layer removal, the previous production steps required time, were expensive, and made for a complex process.

By making the second ARC layer 536 of a disposable ARC material, the problems associated with ARC removal could be eliminated, time saved, costs reduced, and the process simplified. A "disposable" ARC material is defined as an ARC material, which has a selectivity of at least 2:1 to at least one of the layers in the charge-trapping dielectric layer 510. The difficulty of removal or disposal is a function of selectivity and it has been discovered that there must be a selectivity of at least 2:1 from the second ARC layer 536 to the second insulating layer 516 or to the charge-trapping layer 514; i.e., the second ARC layer 536 must be removed at least two times faster than any layer in the charge-trapping dielectric layer 510 so as to avoid penetrating the charge-trapping dielectric layer 510 and exposing the semiconductor substrate 506.

The process of the present invention leaves the hard mask layer 522 patterned in the periphery region 504 and as previously patterned in the core region 502.

Figure 12:
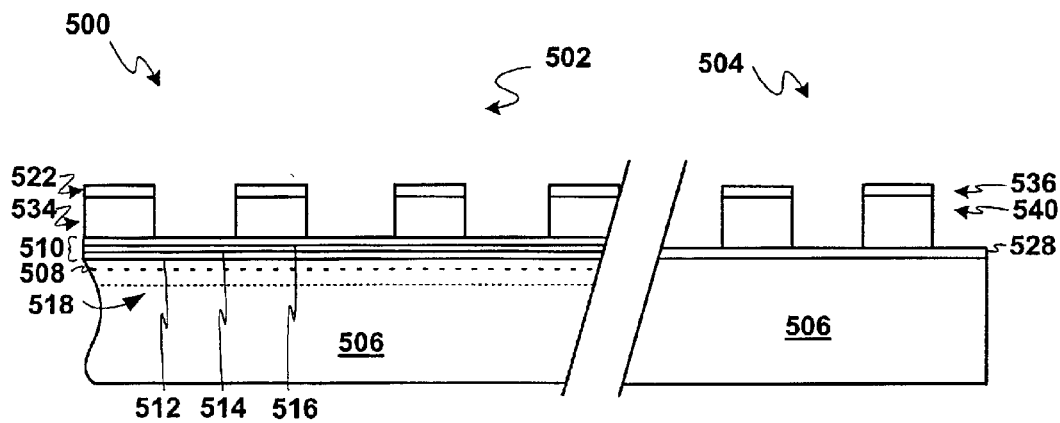
FIG. 12 is the structure of FIG. 11 after formation of gates.

Referring now to FIG. 12, therein is shown the structure of FIG. 11 after the core region 502 and the periphery region 504 have been process by an anisotropic etch process to form gates 540. The wordlines 534 remain substantially the same since the hard mask layer 522 is still in place above them.

Figure 13:
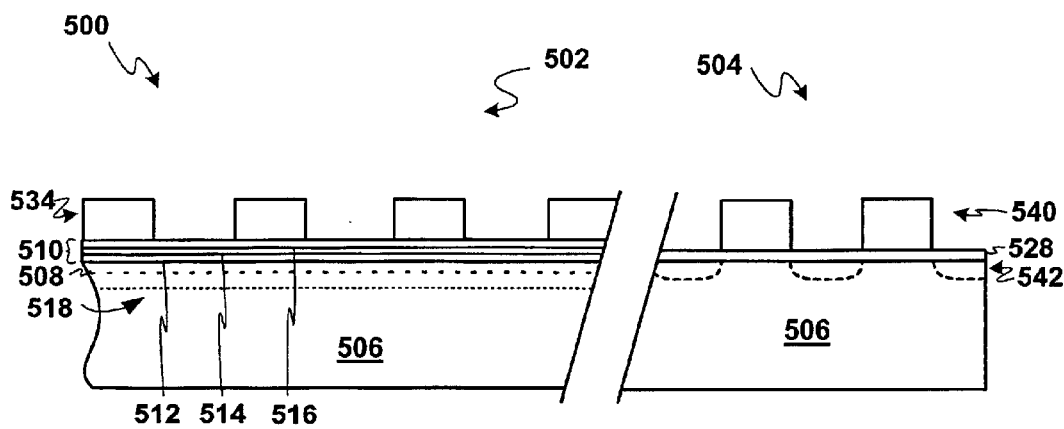
FIG. 13 is the structure of FIG. 12 after removal of the hard mask layer, which is similar to the cross-sectional view of the EEPROM along line 13—13 of FIG. 3.

Referring now to FIG. 13, therein is shown the structure of FIG. 12 after optional removal of the hard mask layer 522, which is similar to the cross-sectional view of the EEPROM 100 along line 13—13 of FIG. 3. To further complete the integrated circuit of which the EEPROM is a part, source/drain junctions 542 have been implanted.

Referring now to FIG. 14, therein is shown a simplified process chart 600 of the present invention which includes steps such as: provide wafer with charge-trapping layer, bitlines, and gate oxide 602; deposit polysilicon, hard mask, and first ARC 604; deposit first photoresist 606; pattern photoresist over core region and cover periphery region 608; form ARC and hard mask over core region 610; remove first photoresist 612; remove first ARC 614; form wordlines 616; deposit second ARC 618; deposit second photoresist 620; pattern photoresist over periphery region and cover core region 622; form second ARC and hard mask over periphery region 624; remove second photoresist 626; remove second ARC 628; form gates 630; remove hard mask 632; and complete integrated circuit 634.

Various alternative sequences, additions, and deletions to this process chart would be obvious to those skilled in the art from a detailed reading of the present disclosure. Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

As a result of developing the above process, it was discovered that certain physical characteristics were necessary among the charge-trapping dielectric material, the wordline material, the hard mask material, and the ARC materials or the photoresist material.

The first ARC materials can be silicon nitride (SiON) or a similar material ($Si_xN_y$) as well as disposable ARC materials.

The second ARC materials, however, must be disposable ARC materials, such as an organic polymer material, nitrogen rich silicon nitride, and a nitrogen rich silicon oxynitride, having a selectivity of at least 2:1 to at least one layer of the charge-trapping dielectric layer.

The hard mask layer must have a selectivity of at least 5:1 from the hard mask layer to the charge-trapping dielectric layer and also to the wordline.

For example, where the charge-trapping dielectric layer is an ONO layer and it is expected that the top oxide layer will be already slightly damaged, the concern will be the possibility of damaging the middle nitride layer. This means that a high selectivity of the second ARC layer to the middle nitride layer is desired of the order of 20:1. In addition, if the wordline is of polysilicon, the hard mask material should be of a material having a lower silicon content than the polysilicon, such as silicon oxide. The removal process will avoid damaging the middle nitride layer but will allow easy removal of the hard mask layer from the polysilicon. For different combinations of materials in the charge-trapping dielectric layer and processing modifications, other materials could be used, for example a nitride such as silicon nitride or a silicon oxynitride.

For example, where the hard mask material is an oxide and the wordline material is polysilicon, the ARC material can be an organic ARC material, such as an organic polymer material, or an inorganic material, such as silicon nitride, nitrogen rich silicon nitride or nitrogen rich silicon oxynitride.

The photoresist will generally be an organic polymer.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor substrate having a charge-trapping material over a core region and a gate insulator material over a periphery region the semiconductor substrate having bitlines provided therein;

depositing a wordline-gate material, a hard mask material, and a first photoresist material over the semiconductor substrate;

patterning the first photoresist material and hard mask material over the core region and covering the periphery region;

removing the first photoresist material;

forming a wordline from the wordline-gate material in the core region;

depositing an anti-reflective coating material and a second photoresist material over the semiconductor substrate, the anti-reflective coating material of a disposable material;

patterning the second photoresist material, the anti-reflective coating material, and the hard mask material over the periphery region and covering the core region;

removing the second photoresist material and the anti-reflective coating material; and forming a gate from the wordline-gate material in the periphery region.

2. The method of manufacturing an integrated circuit as claimed in claim 1 wherein removing the anti-reflective coating material removes the anti-reflective coating material from on the charge-trapping material.

3. The method of manufacturing an integrated circuit as claimed in claim 1 wherein the anti-reflective coating material is of a different material from the semiconductor substrate.

4. The method of manufacturing an integrated circuit as claimed in claim 1 wherein removing the anti-reflective coating material uses a removal process which removes the anti-reflective coating material faster than the charge-trapping dielectric material.

5. The method of manufacturing an integrated circuit as claimed in claim 1 including removing the hard mask material using a removal process which removes the hard mask material faster than the charge-trapping material, the wordline-gate material, and the gate insulator material.

6. The method of manufacturing an integrated circuit as claimed in claim 1 including removing the hard mask material and wherein forming the wordline uses a removal process which removes the wordline-gate material faster than the hard mask material.

7. The method of manufacturing an integrated circuit as claimed in claim 1 wherein depositing the anti-reflective coating material deposits an inorganic material.

8. The method of manufacturing an integrated circuit as claimed in claim 1 wherein depositing the anti-reflective coating material deposits a material selected from a group consisting of an organic polymer material, nitrogen rich silicon nitride, and a nitrogen rich silicon oxynitride.

9. The method of manufacturing an integrated circuit as claimed in claim 1 wherein the charge-trapping material is composed of:
   a first dielectric material;
   a charge-trapping material over the first dielectric material; and
   a second dielectric material over the charge-trapping material.

10. A method of manufacturing an integrated circuit comprising:
   providing a silicon substrate having a charge-trapping layer over a core region and a gate oxide layer over a periphery region the silicon substrate having bitlines provided therein;
   depositing a polysilicon layer, a hard mask layer, a first anti-reflective coating layer, and a first photoresist layer over the silicon substrate;
   patterning the first photoresist layer, first anti-reflective coating layer, and hard mask layer over the core region and covering the periphery region;
   removing the first photoresist layer and the first anti-reflective coating layer;
   forming a polysilicon wordline from the polysilicon layer using the patterned hard mask layer in the core region;
   depositing a second anti-reflective coating layer and a second photoresist layer on the polysilicon wordline, the charge-trapping layer, and the hard mask layer in the periphery region wherein the second anti-reflective coating layer is of a disposable material;
   patterning the second photoresist layer, the second anti-reflective coating layer, and the hard mask layer over the periphery region and covering the core region;
   removing the second photoresist layer and the second anti-reflective coating layer from over the polysilicon wordline and the charge-trapping layer in the core region and the hard mask layer and the polysilicon layer in the periphery region;
   forming a polysilicon gate from the polysilicon layer using the patterned hard mask layer in the periphery region;
   removing the hard mask layer; and
   completing the integrated circuit.

11. The method of manufacturing an integrated circuit as claimed in claim 10 wherein removing the second anti-reflective coating layer removes the second anti-reflective coating layer from on the charge-trapping layer.

12. The method of manufacturing an integrated circuit as claimed in claim 10 wherein depositing the second anti-reflective coating layer deposits a material selected from a group consisting of an organic polymer material, silicon nitride, nitrogen rich silicon nitride, and a nitrogen rich silicon oxynitride.

13. The method of manufacturing an integrated circuit as claimed in claim 10 wherein:
   depositing the first anti-reflective coating layer deposits a silicon oxide; and
   depositing the second anti-reflective coating layer deposits a material selected from a group consisting of an organic polymer material, silicon nitride, nitrogen rich silicon nitride, and a nitrogen rich silicon oxynitride.

14. The method of manufacturing an integrated circuit as claimed in claim 10 wherein removing the second anti-reflective coating layer uses a removal process having at least a 2:1 selectivity of the second anti-reflective coating layer to the charge-trapping layer.

15. The method of manufacturing an integrated circuit as claimed in claim 10 wherein removing the hard mask uses a removal process having at least a 5:1 selectivity of the hard mask layer to the charge-trapping layer, the polysilicon wordline layer, and the gate oxide layer.

16. The method of manufacturing an integrated circuit as claimed in claim 10 wherein forming the polysilicon wordline uses a removal process having at least a 5:1 selectivity of the polysilicon wordline layer to the hard mask layer.

17. The method of manufacturing an integrated circuit as claimed in claim 10 wherein depositing the second anti-reflective coating material deposits a material selected from a group consisting of an organic polymer material, silicon nitride, nitrogen rich silicon nitride, and a nitrogen rich silicon oxynitride.

18. The method of manufacturing an integrated circuit as claimed in claim 10 wherein depositing the hard mask layer deposits a material having less silicon than the polysilicon wordline material.

19. The method of manufacturing an integrated circuit as claimed in claim 10 wherein:
   depositing the charge-trapping layer deposits a charge-trapping material between two insulating materials;
   depositing the hard mask layer deposits a material different from the charge-trapping layer; and
   depositing the anti-reflective coating layer deposits a material different from the hard mask layer.

20. The method of manufacturing an integrated circuit as claimed in claim 10 wherein the charge-trapping dielectric layer is composed of:
   a first oxide material;
   a nitride material over the first oxide material; and
   a second oxide material over the nitride material.

* * * * *

UNITED STATES PATENT AND TRADEMARK OFFICE
CERTIFICATE OF CORRECTION

PATENT NO. : 6,720,133 B1
DATED : April 13, 2004
INVENTOR(S) : Ramsbey et al.

It is certified that error appears in the above-identified patent and that said Letters Patent is hereby corrected as shown below:

<u>Title page,</u>
Item [73], Assignee, add -- Fujitsu Limited
Kanagawa-ken, Japan --

Signed and Sealed this

Twenty-seventh Day of July, 2004

JON W. DUDAS
*Acting Director of the United States Patent and Trademark Office*